(12) United States Patent
Fujimoto

(10) Patent No.: US 11,145,781 B2
(45) Date of Patent: Oct. 12, 2021

(54) LIGHT RECEPTION/EMISSION ELEMENT MODULE AND SENSOR DEVICE

(71) Applicant: KYOCERA Corporation, Kyoto (JP)

(72) Inventor: Naoki Fujimoto, Higashiomi (JP)

(73) Assignee: KYOCERA CORPORATION, Kyoto (JP)

( * ) Notice: Subject to any disclaimer, the term of this patent is extended or adjusted under 35 U.S.C. 154(b) by 72 days.

(21) Appl. No.: 16/605,461

(22) PCT Filed: Apr. 25, 2018

(86) PCT No.: PCT/JP2018/016726
§ 371 (c)(1),
(2) Date: Oct. 15, 2019

(87) PCT Pub. No.: WO2018/199132
PCT Pub. Date: Nov. 1, 2018

(65) Prior Publication Data
US 2021/0126151 A1    Apr. 29, 2021

(30) Foreign Application Priority Data
Apr. 27, 2017 (JP) .............................. JP2017-088706

(51) Int. Cl.
*H01L 31/12* (2006.01)
*H01L 25/16* (2006.01)
*H01L 31/0216* (2014.01)

(52) U.S. Cl.
CPC ........ *H01L 31/12* (2013.01); *H01L 31/02164* (2013.01)

(58) Field of Classification Search
CPC .......................... H01L 31/12; H01L 31/02164
See application file for complete search history.

(56) References Cited

U.S. PATENT DOCUMENTS

| 10,061,057 B2* | 8/2018 | Wong ....................... G01V 8/12 |
| 2014/0084307 A1 | 3/2014 | Halbritter |
| 2016/0025855 A1 | 1/2016 | Camarri et al. |

(Continued)

FOREIGN PATENT DOCUMENTS

| JP | 05-152603 A | 6/1993 |
| JP | 2010-181664 A | 8/2010 |

(Continued)

*Primary Examiner* — Matthew L Reames
(74) *Attorney, Agent, or Firm* — Volpe Koenig

(57) ABSTRACT

A light reception/emission element module comprises a substrate, a light emitting element disposed on the substrate, a first light receiving device disposed on the substrate apart from the light emitting element, and an upper wall located above the substrate. The upper wall comprises a facing surface facing the light emitting element and the first light receiving element. The light reception/emission element module of the disclosure further comprises a second light emitting element disposed on the substrate. The upper wall further comprises a first light passing portion located above the light emitting element, a second light passing portion located above the second light receiving element, and an intermediate portion located in a region between the first light passing portion and the second light passing portion. At least part of a lower surface of the intermediate portion comprises the facing surface.

11 Claims, 14 Drawing Sheets

(56) References Cited

U.S. PATENT DOCUMENTS

2016/0307881 A1 10/2016 Ho
2017/0294426 A1 10/2017 Uchida

FOREIGN PATENT DOCUMENTS

| JP | 2014-519697 A | 8/2014 |
| JP | 2016-134532 A | 7/2016 |
| JP | 2019-016615 A | 1/2019 |
| WO | 2015/136099 A2 | 9/2015 |
| WO | 2016/047545 A1 | 3/2016 |
| WO | 2017/094279 A1 | 6/2017 |
| WO | 2017/209206 A1 | 12/2017 |

* cited by examiner

LIGHT RECEPTION/EMISSION ELEMENT MODULE AND SENSOR DEVICE

CROSS-REFERENCE TO RELATED APPLICATIONS

This application is a national stage entry according to 35 U.S.C. 371 of International Application No. PCT/JP2018/016726 filed on Apr. 25, 2018, which claims priority to Japanese Patent Application No. 2017-088706 filed on Apr. 27, 2017, the contents of which are entirely incorporated herein by reference.

TECHNICAL FIELD

The present disclosure relates to a light reception/emission element module and a sensor device.

BACKGROUND ART

In the related art, as a light reception/emission element module, a reflection type optical coupling device in which a light emitting portion and a light receiving portion are mounted on a substrate is disclosed (see, for example, Japanese Unexamined Patent Publication JP-A 5-152603 (1993) (Patent Literature 1)).

SUMMARY

Technical Problem

In a light reception/emission element module, it is required to monitor the intensity of light emission in a light emitting portion.

Solution to Problem

The light reception/emission element module of the disclosure comprises a substrate, a light emitting element that is disposed on the substrate, a first light receiving element that is disposed on the substrate apart from the light emitting element, and an upper wall that is located above the substrate. The upper wall comprises a facing surface facing the light emitting element and the first light receiving element.

Advantageous Effects of Invention

In the light reception/emission element module of the disclosure, the intensity of light emission in a light emitting portion can be monitored.

DETAILED DESCRIPTION

Hereinafter, a light reception/emission element module of the disclosure will be described with reference to drawings. In the following description, for convenience, an orthogonal coordinate system (X, Y, and Z) is defined, and the positive side in a Z-axis direction is upward, but in the light reception/emission element module of the disclosure, any direction may be upward or downward. A first direction D1 described in the following description is a direction along an X axis, and a second direction D2 is a direction along a Y axis.

<Light Reception/Emission Element Module>

Figure 1:
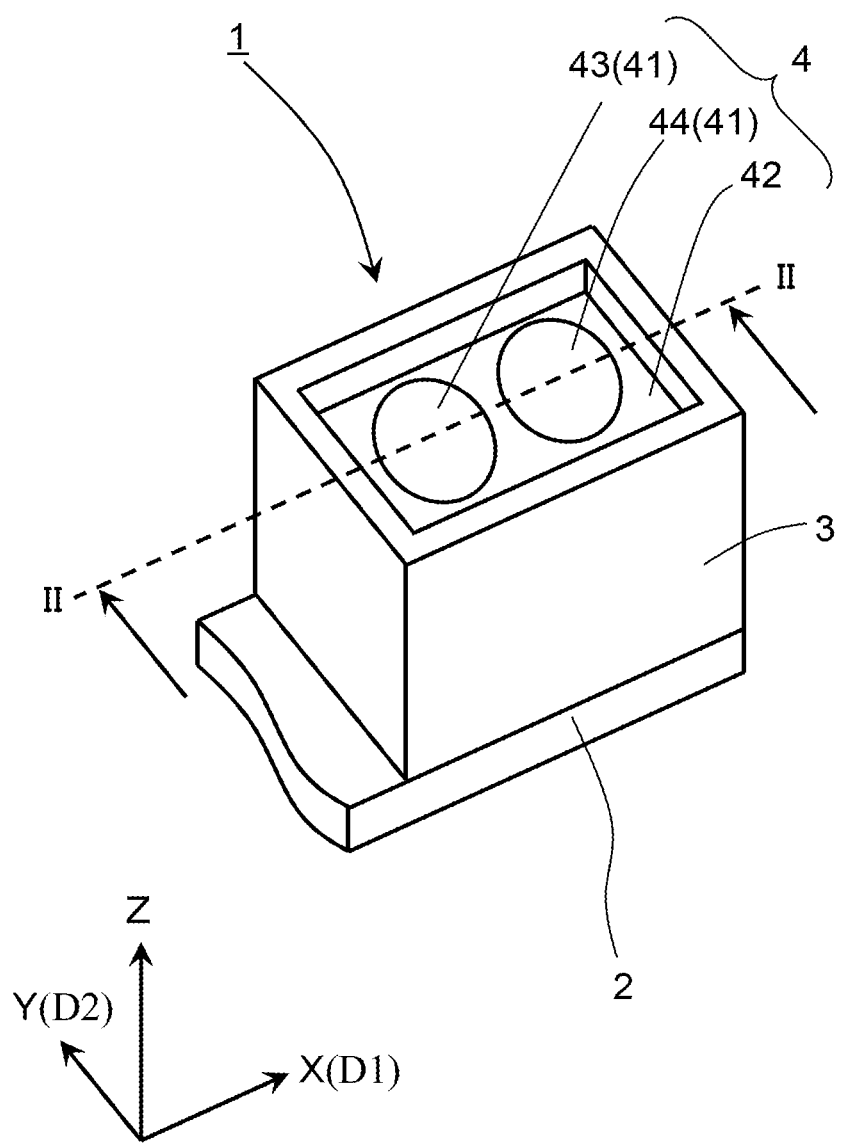
FIG. 1 is a perspective view of a light reception/emission element module of the disclosure.
Figure 2:
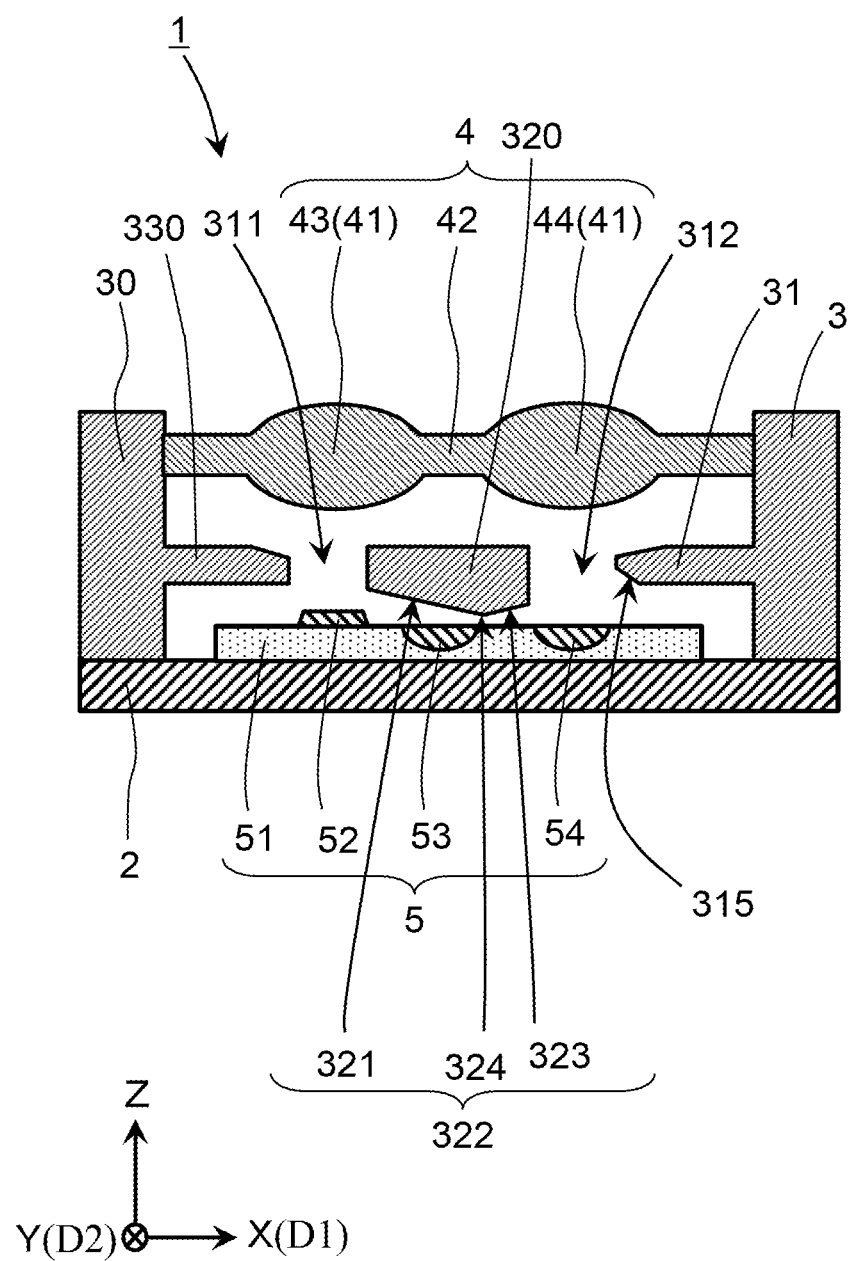
FIG. 2 is a cross-sectional view of the light reception/emission element module of the disclosure.

FIGS. 1 and 2 schematically show an example of a light reception/emission element module of the disclosure. FIG. 2 is a cross-sectional view of the light reception/emission element module shown in FIG. 1 taken along the line II-II.

A light reception/emission element module 1 can sense an object, for example, by irradiating the object with light from a light emitting portion and detecting reflected light from the object with a light receiving portion. The light reception/emission element module 1 can be incorporated into an image forming apparatus such as a copier or a printer, for example, to detect position information, distance information, density information, and the like of an object such as toner or media.

As shown in FIG. 1, the light reception/emission element module 1 comprises a wiring substrate 2, a housing 3 disposed on the wiring substrate 2, and a lens member 4 disposed on the housing 3. Further, as shown in FIG. 2, in the housing 3, a light reception/emission element 5 mounted on the wiring substrate 2 is disposed.

The wiring substrate 2 can support the light reception/emission element 5. The wiring substrate 2 can be electrically connected to an external device to drive the light reception/emission element 5. For example, the light reception/emission element 5 may be mounted on the wiring substrate 2 and electrically connected by a bonding wire.

The wiring substrate 2 may be formed, for example, in a rectangular shape. The wiring substrate 2 can be formed, for example, by laminating an insulating layer and a wiring. The wiring substrate 2 may be, for example, a resin substrate or a ceramic substrate. The wiring substrate 2 of the disclosure is a resin substrate. The insulating layer of the resin substrate is a resin layer, and the insulating layer of the ceramic substrate is a ceramic layer.

The light reception/emission element 5 can emit light and detect incident light. The light reception/emission element 5 comprises a substrate 51, and a light emitting element 52, a light receiving element 54, and a plurality of electrodes 55 which are disposed on the substrate 51. Further, the light reception/emission element 5 comprises a first light receiving element 53 in addition to the light receiving element 54 (second light receiving element 54) in order to monitor the light emission intensity of the light emitting element 52. The light emitting element 52 and the second light receiving element 54 are aligned along the first direction D1. The first light receiving element 53 is disposed in the region between the light emitting element 52 and the second light receiving element 54.

The substrate 51 can support the light emitting element 52, and the first light receiving element 53 and the second light receiving element 54. The substrate 51 may be made of, for example, a semiconductor material. The substrate 51 may be, for example, a substrate of silicon (Si) crystal. The substrate 51 may have, for example, a plate shape. The thickness of the substrate 51 may be, for example, 300 µm or more and 400 µm or less. The planar shape of the substrate 51 may be, for example, a rectangular shape. The substrate 51 can be formed, for example, by slicing an ingot of silicon (Si) into a wafer.

Figure 3:
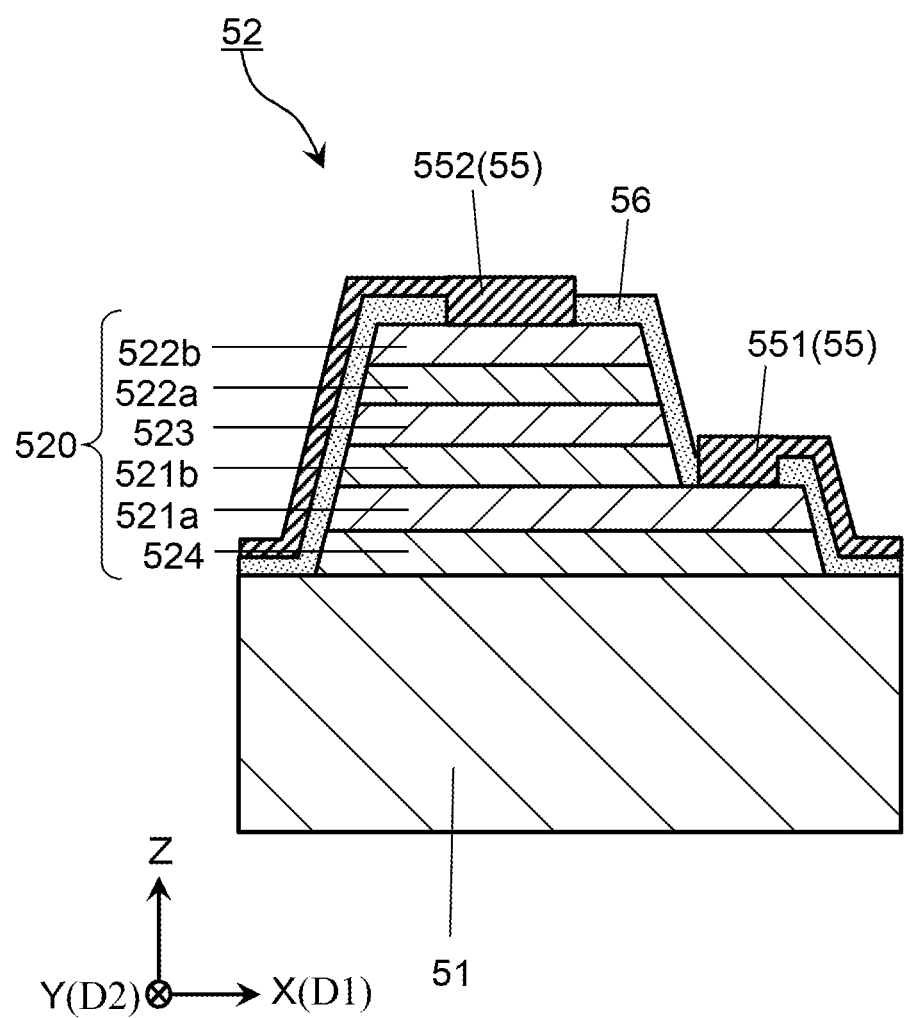
FIG. 3 is an enlarged view of part of a cross section of the light reception/emission element module of the disclosure.

The outline of the light emitting element 52 is schematically shown in FIG. 3. FIG. 3 is an enlarged view of the light emitting element 52 in the cross section of FIG. 2.

The light emitting element 52 can emit light when a voltage is applied. The light emitting element 52 may be, for example, a light emitting diode (LED) or a laser diode (LD). The light emitting element 52 includes a plurality of semiconductor layers 520 disposed on an upper surface of the substrate 51, and a first electrode 551 and a second electrode 552 for applying a voltage to the plurality of semiconductor layers 520.

The plurality of semiconductor layers 520 includes a first semiconductor layer 521 of a first conductivity type, a second semiconductor layer 522 of a second conductivity type, and a third semiconductor layer 523. The third semiconductor layer 523 is located between the first semiconductor layer 521 and the second semiconductor layer 522.

The first semiconductor layer 521 is electrically connected to the first electrode 551. The second semiconductor layer 522 is electrically connected to the second electrode 552. When a voltage is applied by the first electrode 551 and the second electrode 552, carriers such as electrons and holes flow into the third semiconductor layer 523 through the first semiconductor layer 521 and the second semiconductor layer 522, and the third semiconductor layer 523 can emit light.

The first semiconductor layer 521 includes a first contact layer 521a and a first cladding layer 521b stacked on the first contact layer 521a. In addition to the first cladding layer 521b, the first electrode 551 is also disposed on an upper surface of the first contact layer 521a. The third semiconductor layer 523 is stacked on the first cladding layer 521b.

The first contact layer 521a can reduce the electrical contact resistance with the first electrode 551. The first contact layer 521a may be made of, for example, gallium arsenide (GaAs) containing an n-type impurity. The n-type impurity of the first contact layer 521a may be, for example, silicon (Si) or selenium (Se). The thickness of the first contact layer 521a is, for example, 0.8 µm or more and 1 µm or less.

In the present specification, the "first conductivity type" is defined as "n-type", and the "second conductivity type" is defined as "p-type". However, in the present invention, "first conductivity type" may be defined as "p-type". In this case, the "second conductivity type" is defined as "n-type".

The first cladding layer 521b can confine holes in the third semiconductor layer 523. The first cladding layer 521b may be made of, for example, aluminum gallium arsenide (AlGaAs) containing an n-type impurity. The n-type impurity of the first cladding layer 521b may be, for example, silicon (Si) or selenium (Se). The thickness of the first cladding layer 521b is, for example, 0.2 µm or more and 0.5 µm or less.

The second semiconductor layer 522 includes a second cladding layer 522a stacked on the third semiconductor layer 523 and a second contact layer 522b stacked on the second cladding layer 522a. The second electrode 552 is disposed on an upper surface of the second contact layer 522b.

The second cladding layer 522a has a function of confining electrons in the third semiconductor layer 523. The second cladding layer 522a may be made of, for example, aluminum gallium arsenide (AlGaAs) containing a p-type impurity. The p-type impurity of the second cladding layer 522a may be, for example, zinc (Zn) or magnesium (Mg). The thickness of the second cladding layer 522a is, for example, 0.2 µm or more and 0.5 µm or less.

The second contact layer 522b has a function of reducing the electrical contact resistance with the second electrode 552. The second contact layer 522b may be made of, for example, aluminum gallium arsenide (AlGaAs) containing a p-type impurity. The thickness of the second contact layer 522b may be, for example, 0.2 µm or more and 0.5 µm or less. The second contact layer 522b is set to have a carrier density higher than that of the second cladding layer 522a in order to reduce the contact resistance with the electrode.

The third semiconductor layer 523 is a so-called active layer, and is a light emitting portion. The third semiconductor layer 523 can emit light by recombination of carriers. The third semiconductor layer 523 may be made of, for example, aluminum gallium arsenide (AlGaAs) or the like. The thickness of the third semiconductor layer 523 is, for example, 0.1 µm or more and 0.5 µm or less.

An insulating layer 56 is disposed on the surface of the plurality of semiconductor layers 520 except for connection portions with the plurality of electrodes 55 for the purpose of preventing a short circuit between the plurality of electrodes 55.

In addition, the plurality of semiconductor layers 520 may further include a fourth semiconductor layer 524 stacked on the upper surface of the substrate 51. The fourth semiconductor layer 524 can function as a buffer layer of the plurality of semiconductor layers 520. The fourth semiconductor crucible 524 may be made of, for example, gallium arsenide (GaAs) or the like. The thickness of the fourth semiconductor layer 524 is, for example, 2 µm or more and 3 µm or less.

As described above, the plurality of semiconductor layers 520 are stacked and formed on the upper surface of the substrate 51 in the order of the fourth semiconductor layer 524, the first semiconductor layer 521, the third semiconductor layer 523, and the second semiconductor layer 522. The plurality of semiconductor layers 520 can be formed by epitaxial growth sequentially on the upper surface of the substrate 51 by using, for example, a metal organic chemical vapor deposition (MOCVD) method. Further, the insulating layer 56 can be formed, for example, by using a plasma chemical vapor deposition (P-CVD) method. The plurality of electrodes 55 can be formed, for example, by using a vapor deposition method, a sputtering method, a plating method, or the like.

Figure 4:
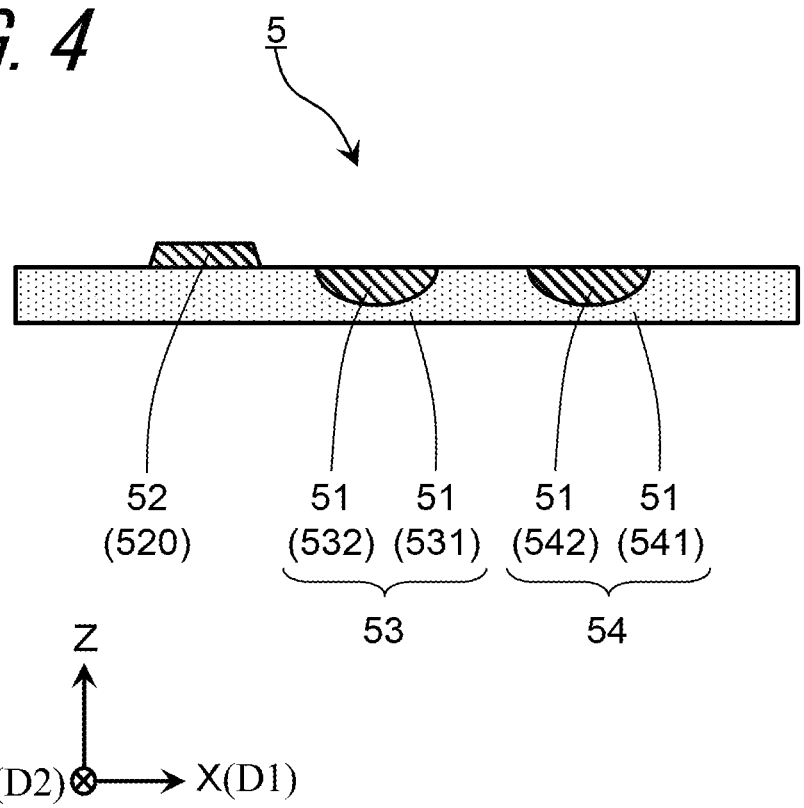
FIG. 4 is an enlarged view of part of a cross section of the light reception/emission element module of the disclosure.
Figure 5:
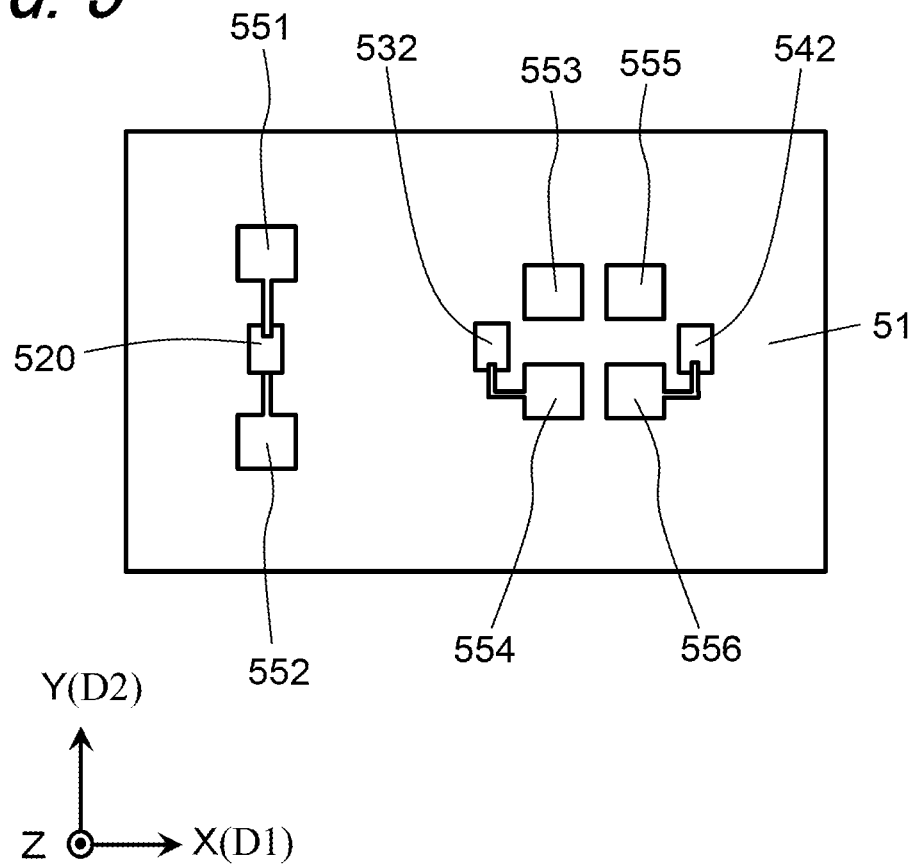
FIG. 5 is a top view of the light reception/emission element module of the disclosure.

FIGS. 4 and 5 show an outline of the light reception/emission element 5. In FIGS. 4 and 5, the wiring substrate 2, the housing 3, and the lens member 4 are not illustrated.

The first light receiving element 53 can receive light and convert the light into a current. The first light receiving element 53 receives light prior to being reflected by the object among the light emitted from the light emitting element 52. As a result, the first light receiving element 53 can monitor the intensity of light emission of the light emitting element 52. The first light receiving element 53 may be, for example, a photo diode (PD) or a photo transistor (PT).

The first light receiving element 53, as shown in FIGS. 4 and 5, includes a first region 531 of the first conductivity type, a second region 532 of the second conductivity type, a third electrode 553 connected to the first region 531, and a fourth electrode 554 connected to the second region 532. The first light receiving element 53 forms a pn junction with the first region 531 and the second region 532 and can convert incident light into a current. The third electrode 553 and the fourth electrode 554 can extract a current obtained by converting incident light.

In the first light receiving element 53 of the disclosure, part of the substrate 51 comprises the first region 531 and the second region 532. In other words, the substrate 51 includes the first region 531 and the second region 532. That is, a pn junction is formed by replacing part of the substrate 51 of the first conductivity type with the second conductivity type and functions as part of the first light receiving element 53. The first region 531 and the second region 532 comprise part of the surface of the substrate 51, and are electrically connected to the third electrode 553 and the fourth electrode 554 disposed on the surface of the substrate 51. In the first light receiving element 53 of the disclosure, the second region 532 comprises part of the upper surface of the substrate 51, and serves as a light receiving region.

Since the substrate 51 of the disclosure forms a pn junction, the substrate 51 has n-type or p-type impurities. The n-type impurity of the substrate 51 may be, for example, phosphorus (P) or nitrogen (N). The p-type impurity of the substrate 51 may be, for example, boron (B), zinc (Zn), magnesium (Mg) or the like. After doping the substrate 51 with an n-type impurity, the first region 531 and the second region 532 can be formed by further doping the p-type impurity.

The second receiver element 54 can receive light and convert the light into a current. Unlike the first light receiving element 53, the second light receiving element 54 receives the light reflected by the object among the light emitted from the light emitting element 52. As a result, the surface condition of the object can be measured. The second light receiving element 54 may be, for example, PD or PT.

The second light receiving element 54, as shown in FIGS. 4 and 5, includes a third region 541 of the first conductivity type, a fourth region 542 of the second conductivity type, a fifth electrode 555 connected to the third region 541, and a sixth electrode 556 connected to the fourth region 542. The second light receiving element 54 forms a pn junction with the third region 541 and the fourth region 542 and can convert incident light into a current. The fifth electrode 555 and the sixth electrode 556 can extract a current obtained by converting incident light.

In the second light receiving element 54 of the disclosure, part of the substrate 51 comprises the third region 541 and the fourth region 542. In other words, the substrate 51 includes the third region 541 and the fourth region 542. That is, a pn junction is formed by replacing part of the substrate 51 of the first conductivity type with the second conductivity type and functions as part of the second light receiving element 54. The third region 541 and the fourth region 542 comprise part of the surface of the substrate 51 and are electrically connected to the fifth electrode 555 and the sixth electrode 556 disposed on the surface of the substrate 51. In the second light receiving element 54 of the disclosure, the fourth region 542 comprises part of the upper surface of the substrate 51, and serves as a light receiving region. Further, in the first light receiving element 53 and the second light receiving element 54 of the disclosure, the first region 531 and the third region 541 are the same. In other words, the first light receiving element 53 and the second light receiving element 54 share the region of the first conductivity type.

The third electrode 553 and the fourth electrode 554 of the first light receiving element 53 may be drawn out in the second direction D2 orthogonal to the first direction D1. As a result, the noise current from the light emitting element 52 can be reduced.

Furthermore, the third electrode 553 and the fourth electrode 554 of the first light receiving element 53 may be located on the opposite side of the light emitting element 52 along the first direction D1. As a result, the noise current from the light emitting element 52 can be reduced.

The third electrode 553 and the fourth electrode 554 of the first light receiving element 53 may be located in the region between the first light receiving element 53 and the second light receiving element 54. As a result, for example, when connecting to the wiring substrate 2 by a bonding wire or the like, a wire or the like is located in a region between the first light receiving element 53 and the second light receiving element 54. Therefore, it is possible to reduce the light entering the first light receiving element 53 from the outside.

Further, the fifth electrode 555 and the sixth electrode 556 of the second light receiving element 54 may be located in the region between the first light receiving element 53 and the second light receiving element 54. As a result, it is possible to reduce the light entering the first receiver element 53 from the outside.

The fifth electrode 555 and the sixth electrode 556 of the second light receiving element 54 may be located in a region excluding the region between the first light receiving element 53 and the second light receiving element 54.

The housing 3 can protect the light reception/emission element 5. Further, the housing 3 can block or reduce light entering the light reception/emission element 5 from the outside.

As shown in FIG. 2, the housing 3 includes a side wall 30 which surrounds the light reception/emission element 5 and an upper wall 31 which is connected to the side wall 30 and is located above the light reception/emission element 5 so as to cover a region surrounded by the side wall 30. The light reception/emission element 5 is disposed in a region surrounded by an inner surface of the side wall 30 and a lower surface of the upper wall 31. The side wall 30 may have, for example, a frame shape, and the upper wall 31 may have, for example, a plate shape. A lower surface of the side wall 30 of the housing 3 may be connected to an upper surface of the wiring substrate 2 via, for example, an adhesive. The upper wall 31 is disposed midway in the height direction of the side wall 30.

Figure 6:
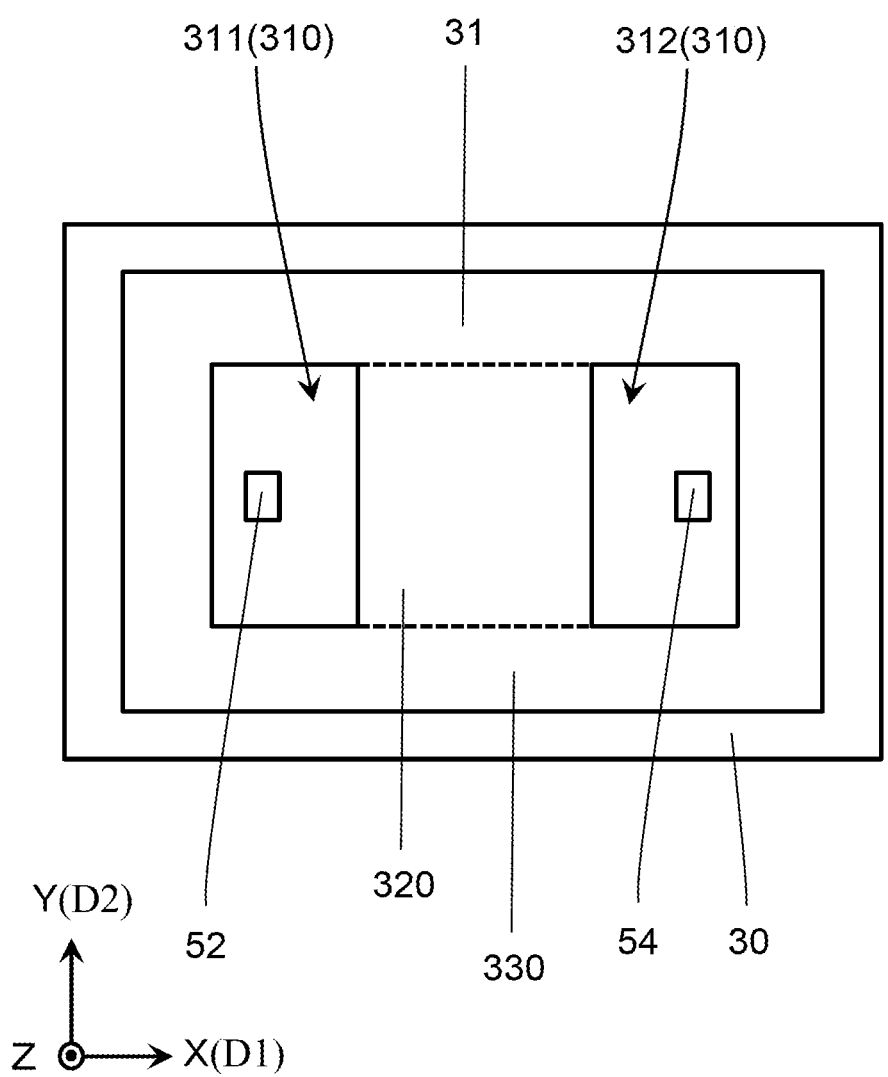
FIG. 6 is a top view of the light reception/emission element module of the disclosure.

As shown in FIGS. 2 and 6, the upper wall 31 comprises a plurality of light passing portions 310, and the plurality of light passing portions 310 allow the light emitted or received by the light reception/emission element 5 to pass through the housing 3. The plurality of light passing portions 310 of the disclosure are a plurality of through holes provided in the upper wall 31. The plurality of light passing portions 310 include a first light passing portion 311 located above the light emitting element 52 and a second light passing portion 312 located above the second light receiving element 54. The emitted light of the light emitting element 52 passes through the first light passing portion 311, and the reflected light from the object passes through the second light passing portion 312.

FIG. 6 shows an outline of the housing 3. In FIG. 6, the wiring substrate 2 and the lens member 4 are not illustrated.

The upper wall 31 of the housing 3 further comprises an intermediate portion 320 located between the plurality of light passing portions 310 and a peripheral portion 330 surrounding the plurality of light passing portions 310 and the intermediate portion 320. The intermediate portion 320 is located in the region between the light emitting element 52 and the second light receiving element 54, and it is possible to divide the region through which the light emitted from the light emitting element 52 passes and the region through which the light received by the second light receiving element 54 passes. The peripheral portion 330 can reduce unnecessary light incident from the outside.

In FIG. 6, a region surrounded by the plurality of light passing portions 310 and dotted lines is the intermediate portion 320, and a region located outside the dotted lines and surrounding the plurality of light passing portions 310 is the peripheral portion 330.

The intermediate portion 320 is located above the first light receiving element 53, as shown in FIG. 2. The intermediate portion 320 includes a facing surface 321 facing the light emitting element 52 and the first light receiving element 53. As a result, the light reception/emission element module 1 can reflect the light entering the facing surface 321 among the light from the light emitting element 52 to the first light receiving element 53. Therefore, the light reception/emission element module 1 can monitor the emission intensity of the light emitting element 52 with the first light receiving element 53.

Further, the intermediate portion 320 includes the facing surface 321, and therefore, the light reception/emission element module 1 can reflect part of light emitted from the light emitting element 52 to the first light receiving element 53. Therefore, since it is not necessary to newly provide another member for monitoring the light emission intensity of the light emitting element 52, the light reception/emission element module 1 can be miniaturized.

The first light receiving element 53 may receive regular reflection light by the facing surface 321 for light emission from the light emitting element 52, or may receive diffuse reflection light. In a case where the first light receiving element 53 receives regular reflection light, the intensity of the received light can be improved. In addition, in a case where the first light receiving element 53 receives the diffuse reflection light, the degree of freedom in design of the facing surface 321 can be improved.

The facing surface 321 may have any arrangement and shape as long as the light from the light emitting element 52 can directly enter and can be reflected to the first light receiving element 53.

The intermediate portion 320 includes a lower surface 322 facing the substrate 51. The lower surface 322 may include a first inclined surface 321 which is inclined toward the light emitting element 52, with respect to the upper surface of the substrate 51. In this case, the first inclined surface 321 is the facing surface 321. As a result, compared to the case where the lower surface 322 of the intermediate portion 320 extends along the upper surface of the substrate 51, the incident angle of the light of the light emitting element 52 on the facing surface 321 can be reduced, and the first light receiving element 53 can be disposed near the light emitting element 52. Therefore, the light reception/emission element module 1 can be miniaturized.

The angle of the first inclined surface 321 with respect to the upper surface of the substrate 51 may be any angle as long as the light from the light emitting element 52 can be reflected to the first light receiving element 53. The first light receiving element 53 may be disposed anywhere as long as the first light receiving element 53 can receive the reflected light from the first inclined surface 321.

The lower surface 322 of the intermediate portion 320 may include a second inclined surface 323 inclined toward the second light receiving element 54, with respect to the upper surface of the substrate 51. As a result, it is possible to reduce the light entering the second light receiving element 54 from the light emitting element 52 without passing through the object.

The lower surface 322 of the intermediate portion 320 may include a top portion 324 protruding downward. The top portion 324 may be located between the first light receiving element 53 and the second light receiving element 54. As a result, it is possible to reduce the light entering the second light receiving element 54 from the light emitting element 52 without passing through the object. In a case where the lower surface 322 includes the first inclined surface 321 and the second inclined surface 323, an intersection of the first inclined surface 321 and the second inclined surface 323 is the top portion 324. In a case where the lower surface 322 includes only the first inclined surface 321, an intersection between the first inclined surface 321 and an inner surface of the second light passing portion 312 is the top portion 324.

The portion of the lower surface 322 of the intermediate portion 320 closest to the substrate 51 (the top portion 324) may be located above the light emitting element 52, or may be located below an upper surface of the light emitting element 52 (a plurality of semiconductor layers 520). If part of the lower surface 322 of the intermediate portion 320 is located above the light emitting element 52, the contact between the upper wall 31 and the substrate 51 can be prevented. On the other hand, if part of the lower surface 322 of the intermediate portion 320 is located below the upper surface of the light emitting element 52, light entering the second light receiving element 54 from the light emitting element 52 without passing through the object can be reduced.

In a case where the lower surface 322 of the intermediate portion 320 includes the second inclined surface 323, the second inclined surface 323 may be located above an imaginary line connecting the upper surface of the light emitting element 52 and the top portion 324. As a result, it is possible to reduce the light entering the second light receiving element 54 from the light emitting element 52 without passing through the object.

In the light reception/emission element 5 of the disclosure, a distance between the emitting element 52 and the first light receiving element 53 is set to be larger than a distance between the second light receiving element 54 and the first light receiving element 53.

An edge of the first light passing portion 311 may be located outside the second region 532 of the first light receiving element 53 in a planar direction as shown in FIGS. 2 and 6. As a result, light entering the first light receiving element 53 from the outside can be reduced.

The edge of the first light passing portion 311 may be located in the region between the light emitting element 52 (the plurality of semiconductor layers 520) and the first light receiving element 53 (the second region 532) in the planar direction. As a result, the light quantity of the light emitting element 52 extracted from the light reception/emission element module 1 can be increased.

An edge of the second light passing portion 312 may be located outside the second region 532 of the first light receiving element 53 in the planar direction, as shown in FIGS. 2 and 6. As a result, light entering the first light receiving element 53 from the outside can be reduced.

FIGS. 7 to 13 show various examples of the positional relationship between the housing 3 and the light reception/emission element 5. Each drawing shows an enlarged part corresponding to part of the cross section of FIG. 2. The broken lines shown in each drawing indicate imaginary lines described in the following description.

An upper surface of the upper wall 31 may include a third inclined surface 313 approaching the lower surface thereof from the side wall 30 toward the first light passing portion 311. As a result, it is possible to reduce light which enters an inner surface of the first light passing portion 311 from the outside is partially reflected by the third inclined surface 313 and enters the first light receiving element 53. Therefore, the monitoring accuracy of the light reception/emission element module 1 can be improved.

Further, the upper wall 31 may include a first light shielding portion 31a located on an imaginary line connecting the third inclined surface 313 and the second region 532. As a result, the monitoring accuracy of the light reception/emission element module 1 can be improved. The "light shielding portion" may be any one as long as the portion reduces the intensity of light passing therethrough, and is not limited to one that makes the intensity of light zero.

Figure 7:
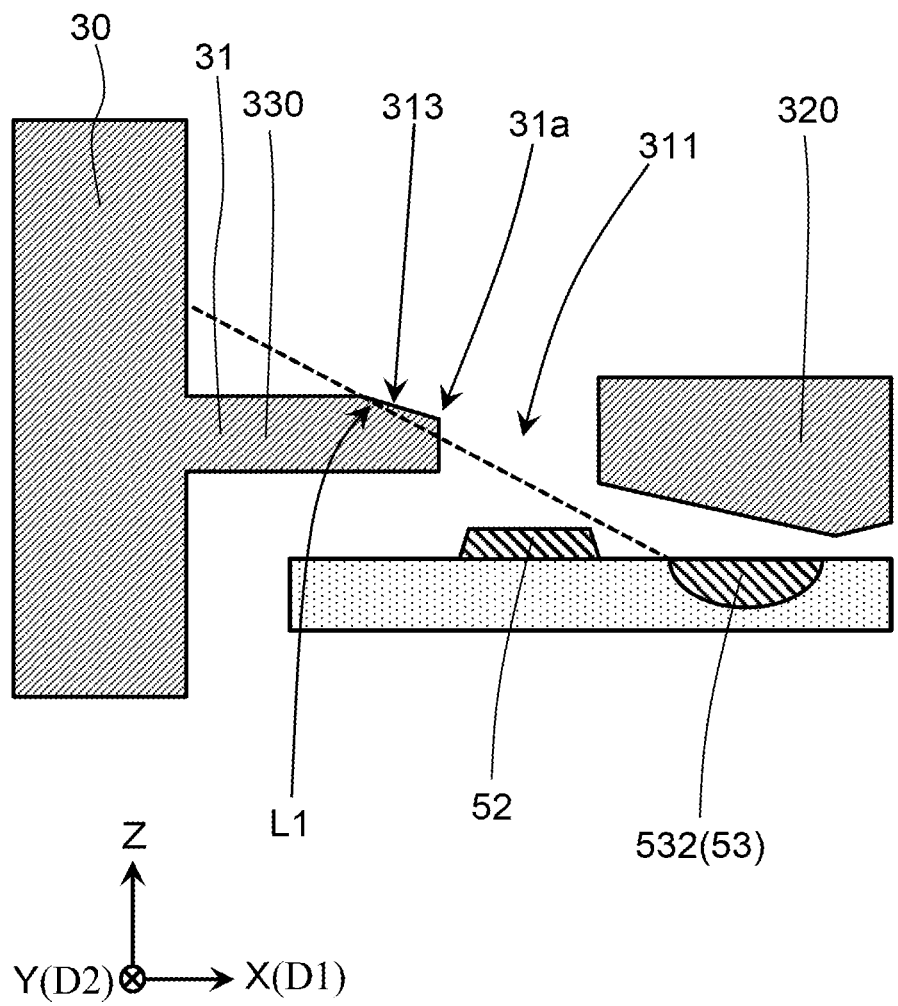
FIG. 7 is an enlarged view of part of a cross section of the light reception/emission element module of the disclosure.

In the upper wall 31 of the disclosure, for example, as shown in FIG. 7, the peripheral portion 330 includes the third inclined surface 313 on the upper surface thereof. In addition, when a first imaginary line L1 connecting an upper end of the third inclined surface 313 and an edge of the second region 532 on the light emitting element 52 side is defined, an intersection of the third inclined surface 313 and the first light passing portion 311 is located above the first imaginary line L1. Therefore, the intersection of the third inclined surface 313 and the first light passing portion 311 functions as the first light shielding portion 31a.

The upper surface of the upper wall 31 may include a fourth inclined surface 314 approaching the lower surface thereof from the side wall 30 toward the second light passing portion 312. As a result, it is possible to reduce the light entering the second light passing portion 312 and entering the first light receiving element 53 so as to improve the monitoring accuracy of the light reception/emission element module 1.

In addition, the upper wall 31 may include a second light shielding portion 31b located on an imaginary line connecting the fourth inclined surface 314 and the second region 532. As a result, the monitoring accuracy of the light reception/emission element module 1 can be improved.

Figure 8:
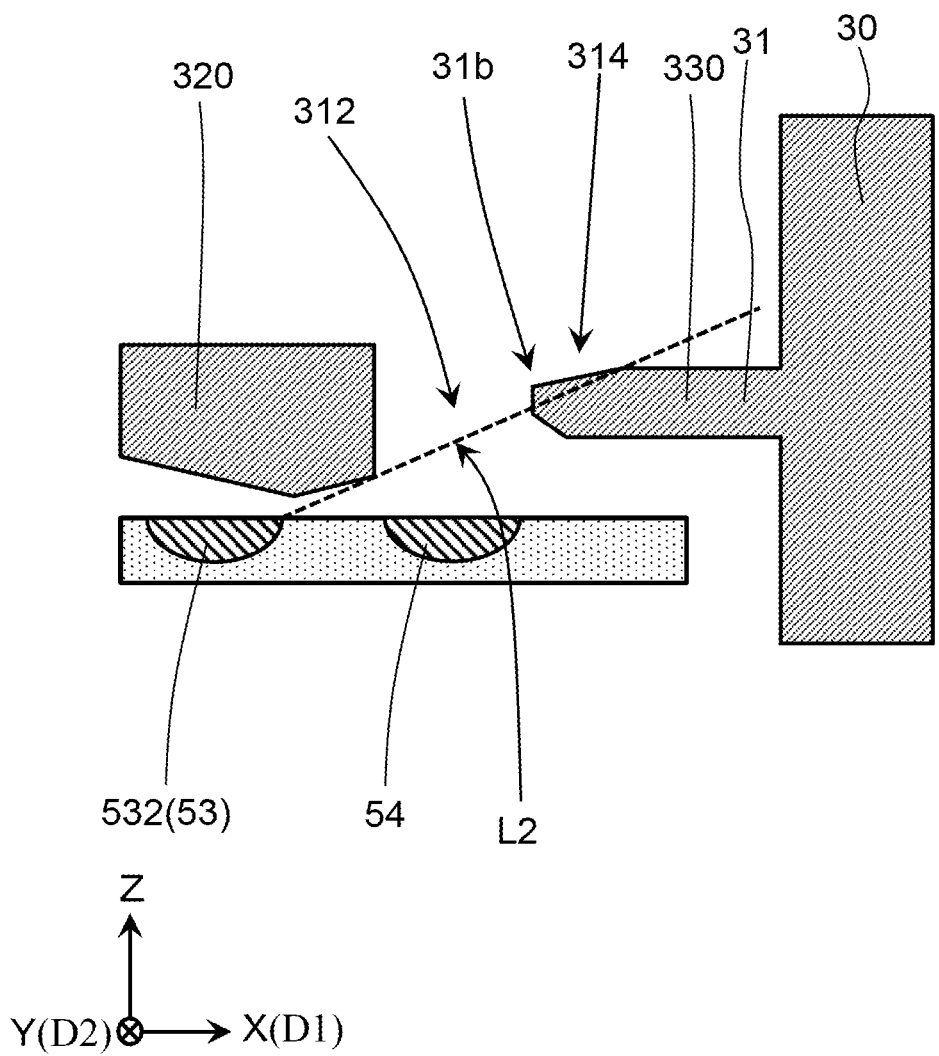
FIG. 8 is an enlarged view of part of a cross section of the light reception/emission element module of the disclosure.

In the upper wall 31 of the disclosure, for example, as shown in FIG. 8, the peripheral portion 330 includes the fourth inclined surface 314 on the upper surface thereof. Further, when a second imaginary line L2 connecting an upper end of the fourth inclined surface 314 and the edge of the second region 532 on the second light receiving element 54 side is defined, an intersection of the fourth inclined surface 314 and the second light passing portion 312 is located above the second imaginary line L2. Therefore, the intersection of the fourth inclined surface 314 and the second light passing portion 312 functions as the second light shielding portion 31b.

The lower surface of the intermediate portion 320 may include a third light shielding portion 31c located on an imaginary line connecting the inner surface of the first light passing portion 311 in the peripheral portion 330 and the second region 532. As a result, it is possible to reduce the light entering the first light passing portion 311 and entering the second region 532 so as to improve the monitoring accuracy of the light reception/emission element module 1.

Figure 9:
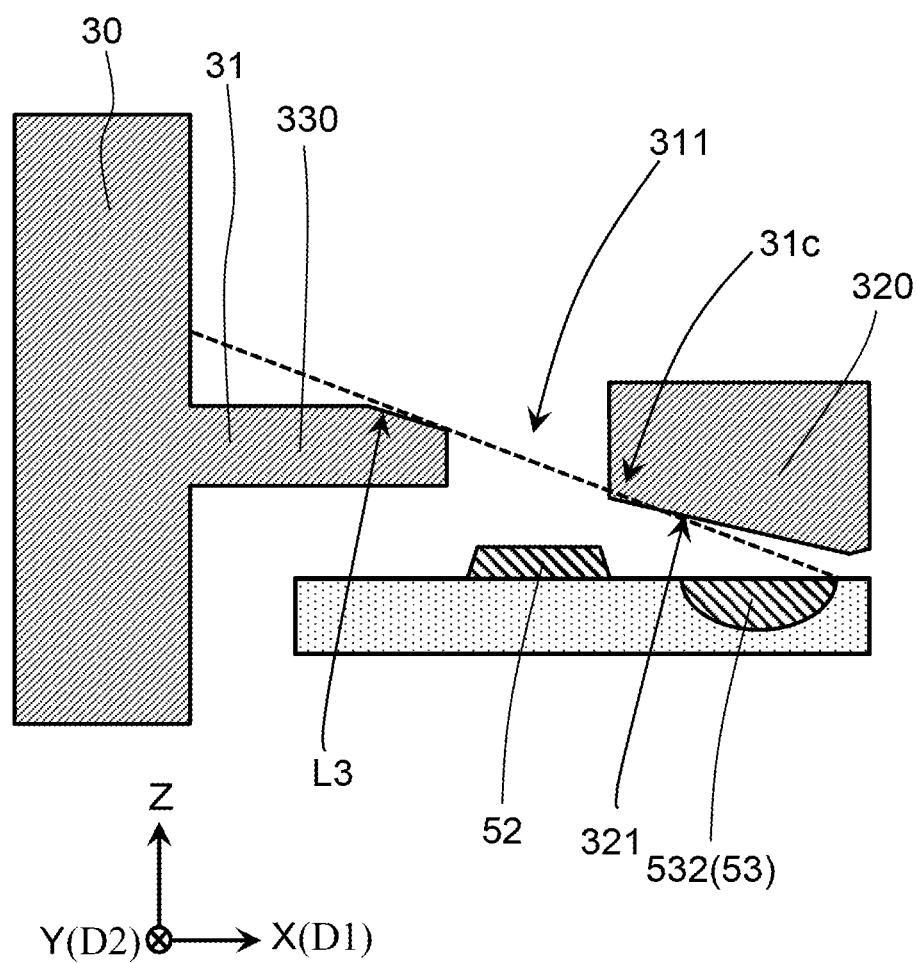
FIG. 9 is an enlarged view of part of a cross section of the light reception/emission element module of the disclosure.

For example, as shown in FIG. 9, in the intermediate portion 320 of the disclosure, when a third imaginary line L3 connecting an upper end of the inner surface of the first light passing portion 311 in the peripheral portion 330 and the edge of the second region 532 on the second light receiving element side is defined, an intersection of the first inclined surface 321 and the first light passing portion 311 is located below the third imaginary line L3. Therefore, the intersection of the first inclined surface 321 and the first light passing portion 311 functions as the third light shielding portion 31c.

The side wall 30 may be located on an imaginary line connecting an upper end of the first light passing portion 311 in the peripheral portion 330 of the upper wall 31 and the second region 532. As a result, it is possible to reduce the light entering the first light passing portion 311 from the outside and entering the second region 532 so as to improve the monitoring accuracy of the light reception/emission element module 1.

The intermediate portion 320 may include a fourth light shielding portion 31d located on an imaginary line connecting the inner surface of the second light passing portion 312 in the peripheral portion 330 and the second region 532. As a result, it is possible to reduce the light entering the second light passing portion 312 and entering the second region 532 so as to improve the monitoring accuracy of the light reception/emission element module 1.

Figure 10:
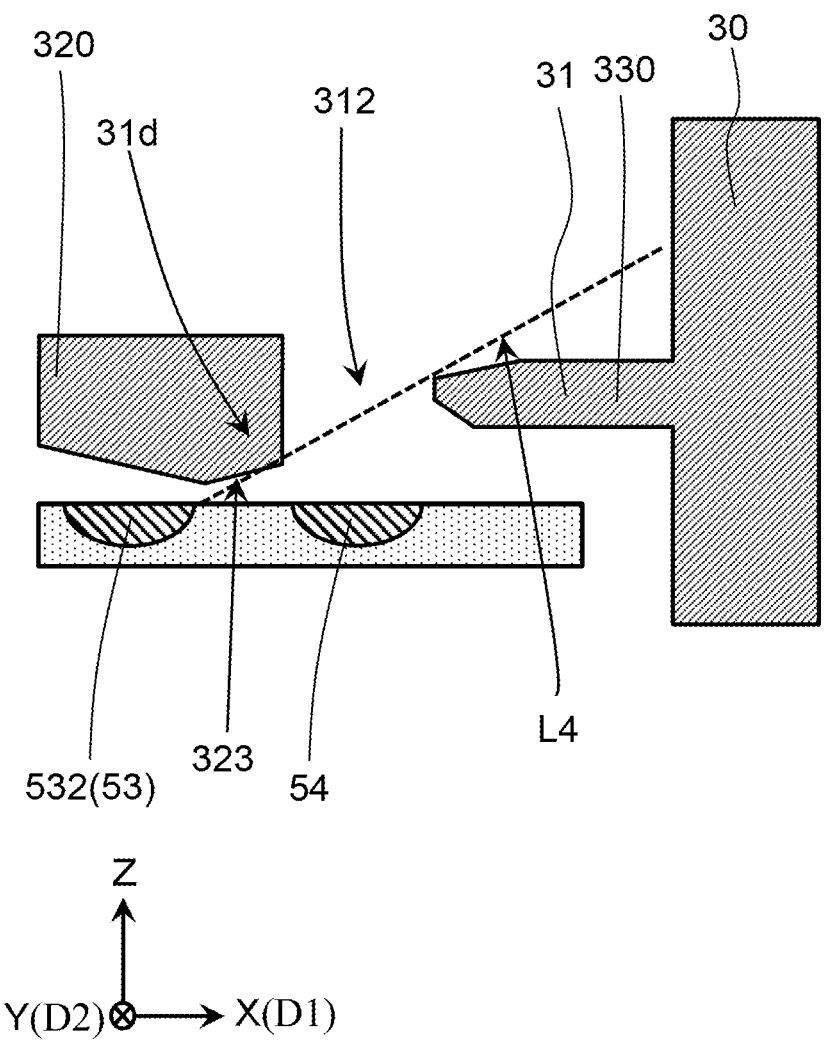
FIG. 10 is an enlarged view of part of a cross section of the light reception/emission element module of the disclosure.

In the intermediate portion 320 of the disclosure, for example, as shown in FIG. 10, when a fourth imaginary line L4 connecting an upper end of the inner surface of the second light passing portion 312 in the peripheral portion 330 and the edge of the second region 532 on the second light receiving element 54 side is defined, an intersection of the second light passing portion 312 and the second inclined surface 323 is located below the fourth imaginary line L4. Therefore, the intersection of the second light passing portion 312 and the second inclined surface 323 functions as the fourth light shielding portion 31d.

The side wall 30 may be located on an imaginary line connecting an upper end of the second light passing portion 312 in the peripheral portion 330 of the upper wall 31 and the second region 532. As a result, it is possible to reduce the light entering the second light passing portion 312 from the outside and entering the second region 532 so as to improve the monitoring accuracy of the light reception/emission element module 1.

The intermediate portion 320 may include a fifth light shielding portion 31e located on an imaginary line that inclines upward at the same angle as an imaginary line connecting the inner surface of the first light passing portion 311 in the peripheral portion 330 and the second region 532, with respect to the inner surface of the first light passing portion 311. As a result, the monitoring accuracy of the light reception/emission element module 1 can be improved.

Figure 11:
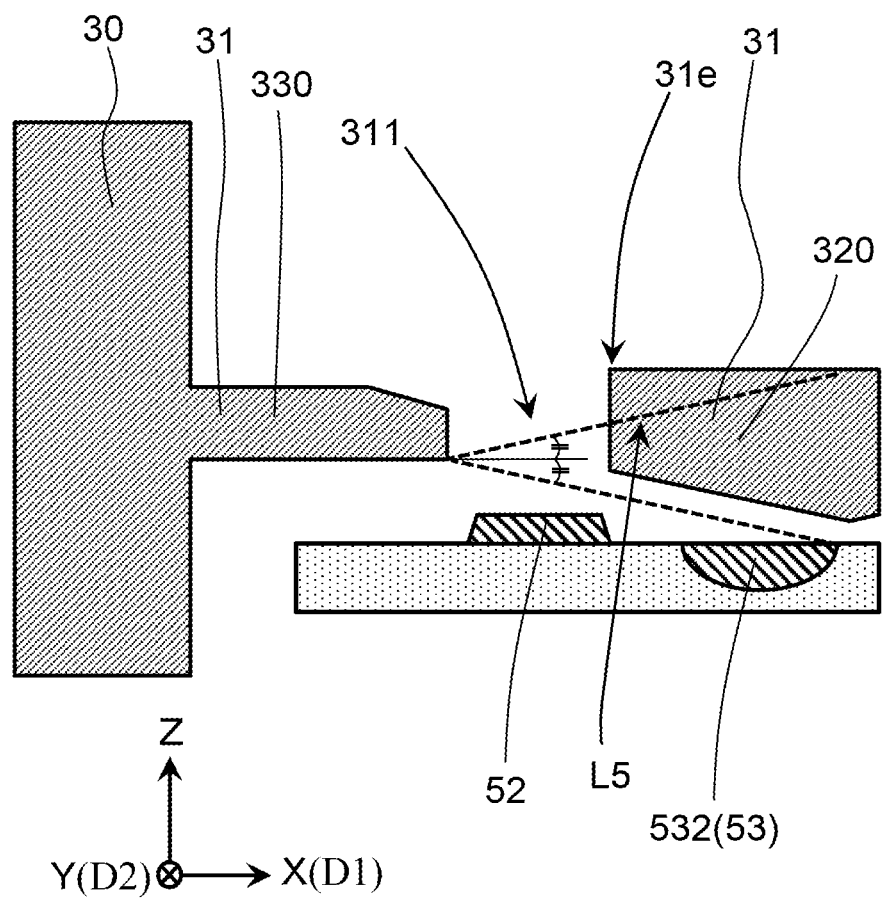
FIG. 11 is an enlarged view of part of a cross section of the light reception/emission element module of the disclosure.

In the intermediate portion 320 of the disclosure, for example, as shown in FIG. 11, when a fifth imaginary line L5 that inclines upward at the same angle as an imaginary line connecting the lower end of the inner surface of the first light passing portion 311 in the peripheral portion 330 and the edge of the second region 532 on the second light receiving element side, with respect to the inner surface of the first light passing portion 311 is defined, an intersection of the upper end of the first light passing portion 311 and the upper surface of the upper wall 31 (the intermediate portion 320) is located above the fifth imaginary line L5. Therefore, the intersection of the upper end of the first light passing portion 311 and the upper surface of the upper wall 31 functions as the fifth light shielding portion 31e.

The intermediate portion 320 may include a sixth light shielding portion 31f located on an imaginary line that inclines upward at the same angle as an imaginary line connecting the inner surface of the second light passing portion 312 in the peripheral portion 330 and the second region 532, with respect to the inner surface of the second light passing portion 312. As a result, the monitoring accuracy of the light reception/emission element module 1 can be improved.

Figure 12:
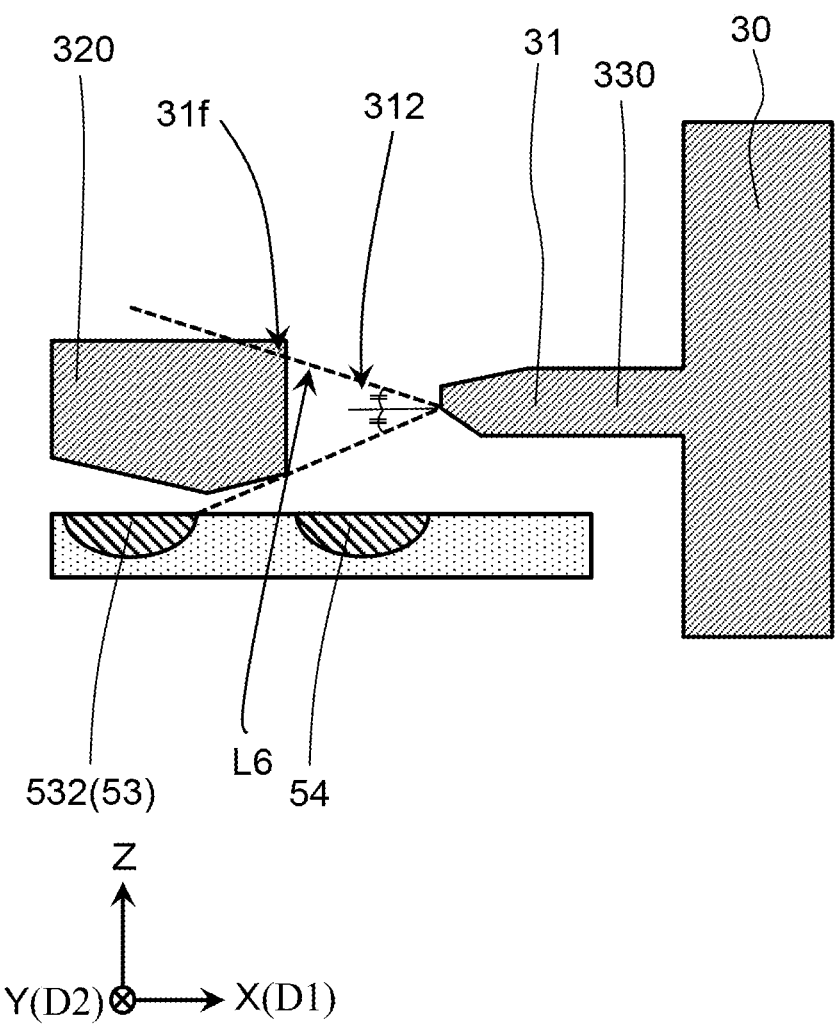
FIG. 12 is an enlarged view of part of a cross section of the light reception/emission element module of the disclosure.

In the intermediate portion 320 of the disclosure, for example, as shown in FIG. 12, when a sixth imaginary line L6 that inclines upward at the same angle as an imaginary line connecting the lower end of the inner surface of the second light passing portion 312 in the peripheral portion 330 and the edge of the second region 532 on the second light receiving element 54 side, with respect to the inner surface of the second light passing portion 312 is defined, an intersection of the upper end of the second light passing portion 312 and the upper surface of the upper wall 31 (the intermediate portion 320) is located above the sixth imaginary line L6. Therefore, the intersection of the upper end of the second light passing portion 312 and the upper surface of the upper wall 31 functions as the sixth light shielding portion 31f.

The intermediate portion 320 may include a seventh light shielding portion 31g located on an imaginary line connecting the top portion 324 of the lower surface and the second region 532. As a result, the monitoring accuracy of the light reception/emission element module 1 can be improved.

Figure 13:
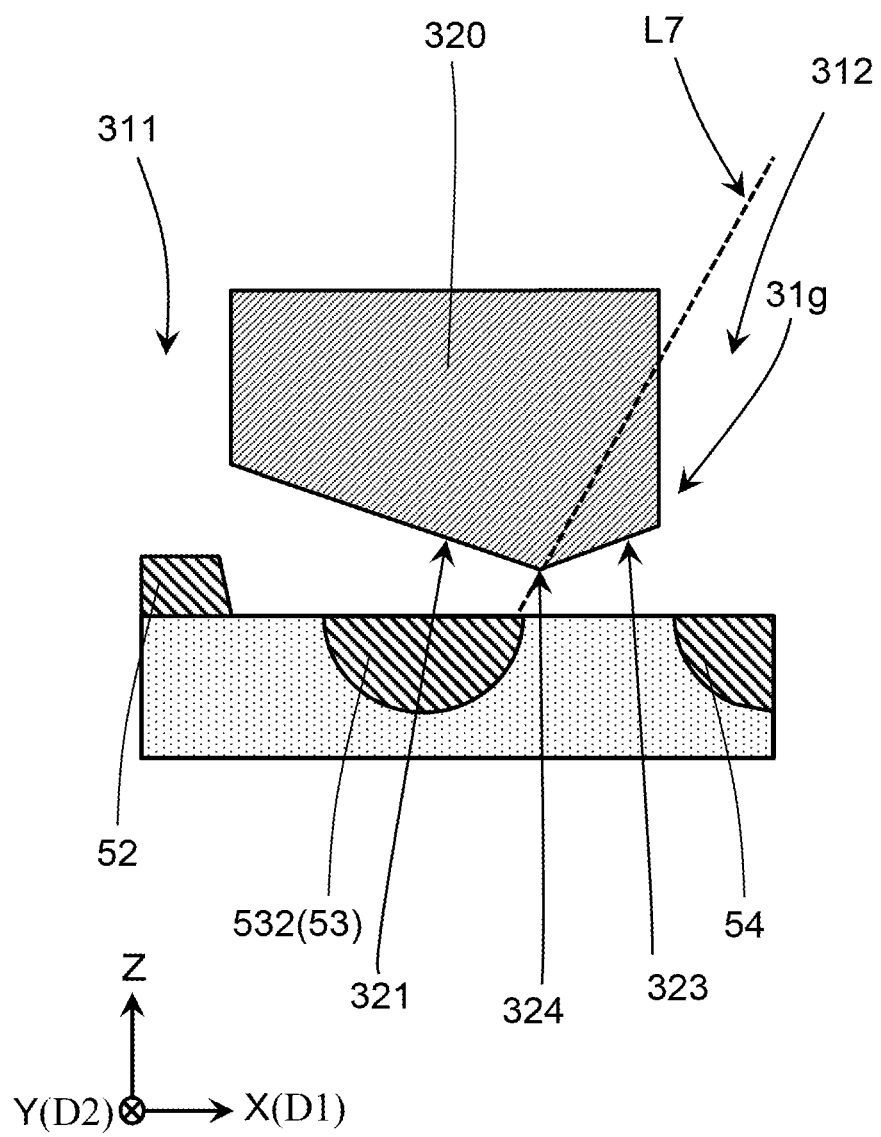
FIG. 13 is an enlarged view of part of a cross section of the light reception/emission element module of the disclosure.

In the intermediate portion 320 of the disclosure, for example, as shown in FIG. 13, when a seventh imaginary line L7 connecting the top portion 324 of the lower surface and the edge of the second region 532 on the second light receiving element 54 side is defined, the intersection of the second light passing portion 312 and the second inclined surface 323 is located below the imaginary line L7. Therefore, the intersection of the second light passing portion 312 and the second inclined surface 323 functions as the seventh light shielding portion 31g.

The inner surface of the second light passing portion 312 may have a fifth inclined surface 315 which is inclined away from the first light receiving element 53 from the upper end to the lower end thereof. As a result, the monitoring accuracy of the light reception/emission element module 1 can be improved.

The housing 3 can be formed by, for example, a general-purpose plastic such as polypropylene resin (PP), polystyrene resin (PS), vinyl chloride resin (PVC), polyethylene terephthalate resin (PET), and acrylonitrile-butadiene-styrene resin (ABS), an engineering plastic such as polyamide resin (PA) and poly-carbonate resin (PC), a super engineering plastic such as liquid crystal polymer, and a metal material such as aluminum (Al) and titanium (Ti). The housing 3 can be formed, for example, by injection molding or otherwise.

The lens member 4 can guide the light from the light emitting element 52 to the object, or can guide the reflected light from the object to the second light receiving element 54. The lens member 4 includes a lens portion 41 through which light passes and a support portion 42 which supports the lens portion 41, as shown in FIGS. 1 and 2. The lens member 4 is fitted in a region surrounded by the inner surface of the side wall 30 of the housing 3 and the upper surface of the upper wall 31 via the support portion 42.

The lens member 4 can be formed of a light-transmittable material. The lens member 4 can be made of, for example, plastics such as thermosetting resin such as silicone resin, urethane resin, and epoxy resin, or thermoplastic resin such as polycarbonate resin and acrylic resin, or sapphire and inorganic glass. The lens member 4 can be formed, for example, by injection molding or otherwise.

The lens portion 41 can condense and guide the emitted light from the light emitting element 52 and the reflected light from the object. The lens portion 41 include a first lens 43 for condensing the emitted light from the light emitting element 52 and a second lens 44 for condensing the reflected light from the object. For example, a convex lens, a spherical lens, or an aspheric lens can be used as each of the first lens 43 and the second lens 44 of the disclosure.

The support portion 42 can hold the lens portion 41. The support portion 42 can be formed in a plate shape, for example. The support portion 42 may hold the lens portion 41 by being formed integrally with the lens portion 41, or may hold the lens portion 41 by fitting the first lens 43 and the second lens 44 of the lens portion 41 into the support portion 42.

The disclosure is not limited to the above-described embodiments, and various changes, improvements, and the like can be made without departing from the scope of the disclosure.

The first light receiving element 53 and the second light receiving element 54 of the disclosure have part of the substrate 51 as a component, but the substrate 51 according to the disclosure may not comprise part of the first light receiving element 53 and the second light receiving element 54. For example, instead of the substrate 51, the light receiving elements may be individually mounted on the substrate by using the wiring substrate 2 as a substrate. Also, in this case, the light emitting elements may be separately mounted.

Further, in the substrate 51 of the disclosure, the region excluding the region of the second conductivity type is of the first conductivity type, but it is sufficient that only the portion that functions as a light receiving element is of the first conductivity type.

In addition, the first light receiving element 53 and the second light receiving element 54 of the disclosure are PN junctions, but may be PIN junctions including a third conductivity type.

Figure 14:
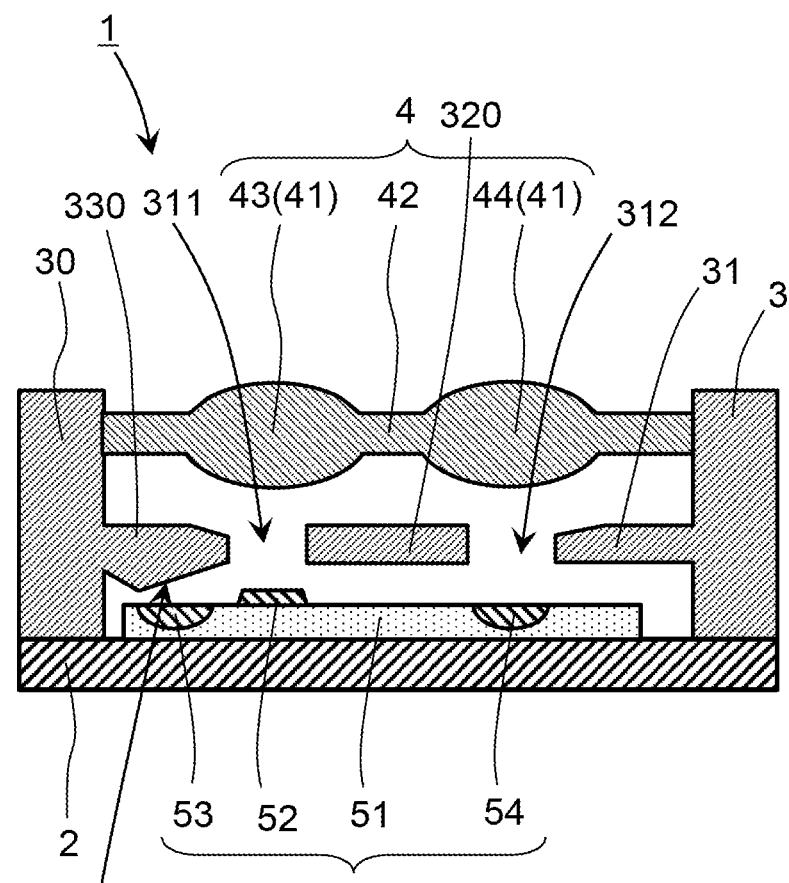
FIG. 14 is a cross-sectional view showing an overview of the light reception/emission element module of the disclosure.

Further, the first light receiving element 53 of the disclosure is disposed in the region between the light emitting element 52 and the second light receiving element 54. However, the first light receiving element 53 may not be disposed in the region between the light emitting element 52 and the second light receiving element 54 as long as the light of the light emitting element 52 can be monitored. For example, as shown in FIG. 14, the light emitting element 52 may be disposed in the region between the first light receiving element 53 and the second light receiving element 54.

Moreover, the case where a single light emitting element is provided is described in the above-described embodiment, but a plurality of light emitting elements 52 may be provided. Further, the first light receiving element 53 and the second light receiving element 54 may be provided according to the number of the light emitting elements 52.

<Sensor Device>

Figure 15:
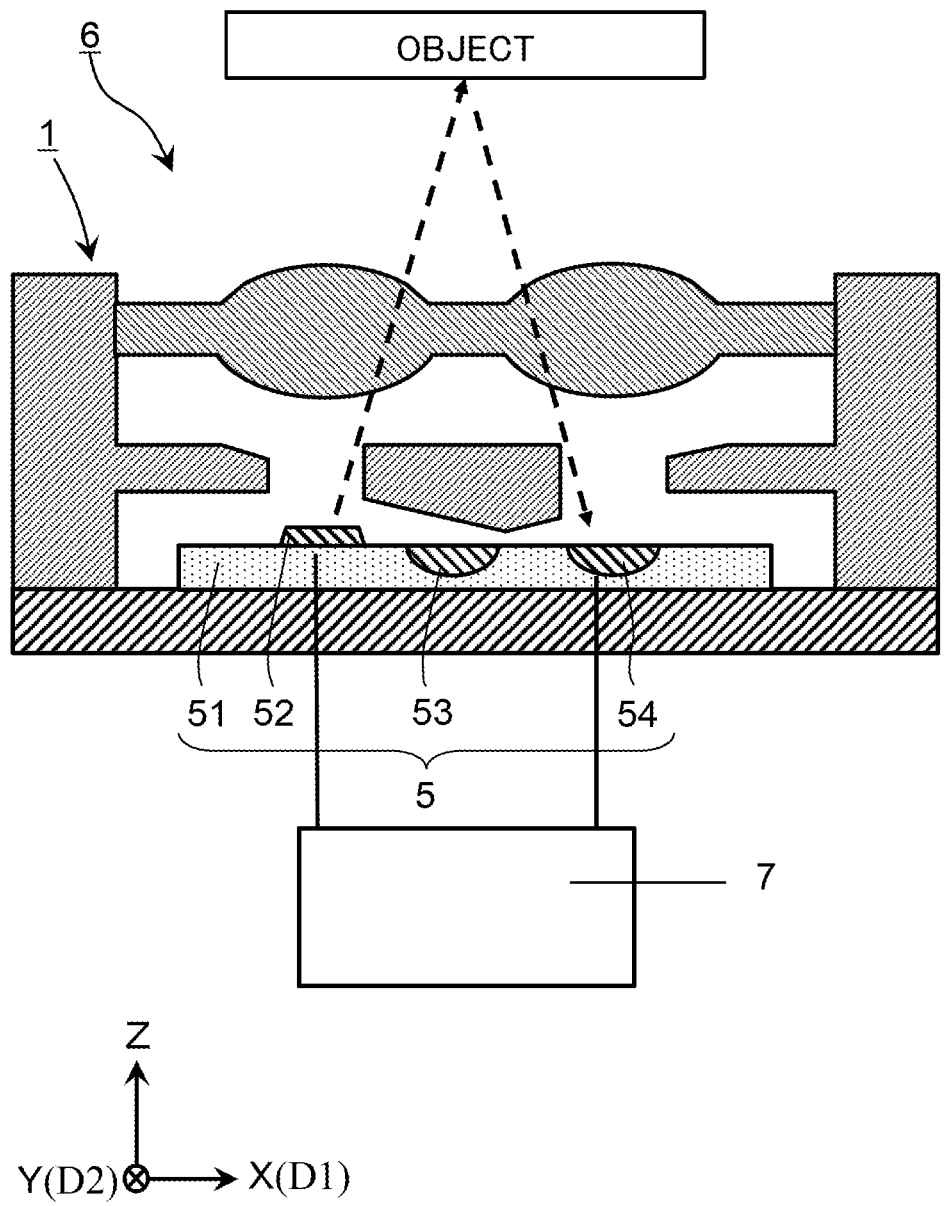
FIG. 15 is a cross-sectional view showing an overview of a sensor device of the disclosure.

Next, a sensor device 6 provided with the light reception/emission element 5 will be described. As shown in FIG. 15, the sensor device 6 of the disclosure includes the light reception/emission element module 1 and a control circuit 7 which is electrically connected to the light reception/emission element module 1. The control circuit 7 can control the light reception/emission element module 1. The control circuit 7 includes, for example, a drive circuit for driving the light reception/emission element 5, an arithmetic circuit for processing the current of the light reception/emission element 5, or a communication circuit for communicating with an external device. The broken arrow shown in FIG. 15 exemplifies a path of light which is emitted from the light emitting element 52, is reflected by the object, and enters the second light receiving element 54.

REFERENCE SIGNS LIST

1: Light reception/emission element module
2: Wiring substrate
3: Housing
4: Lens member
5: Light reception/emission element
6: Sensor device
7: Control circuit

The invention claimed is:

1. A light reception/emission element module, comprising:
  a substrate;
  a light emitting element disposed on the substrate;
  a first light receiving element disposed on the substrate apart from the light emitting element;
  a second light receiving element disposed on the substrate;
  a side wall disposed on the substrate, surrounding the light emitting element, the first light receiving element and the second light receiving element; and
  an upper wall located above the substrate so as to cover a region surrounded by the side wall,
  the light emitting element and the second light receiving element being aligned along a first direction,
  the first light receiving element being disposed in a region between the light emitting element and the second light receiving element,
  the upper wall comprising a facing surface facing the light emitting element and the first light receiving element, a first light passing portion located above the light emitting element, a second light passing portion located above the second light receiving element, and an intermediate portion located in a region between the first light passing portion and the second light passing portion,
  wherein a lower surface of the intermediate portion comprises a first inclined surface which is the facing surface inclined toward the light emitting element and a second inclined surface inclined toward the second light receiving element,
  an upper surface of the upper wall comprises a third inclined surface approaching a lower surface of the upper wall from the side wall toward the first light passing portion and a first light shielding portion which is located on an imaginary line connecting the third inclined surface and a light receiving region of the first light receiving element.

2. The light reception/emission element module according to claim 1, wherein an upper surface of the upper wall comprises a fourth inclined surface that inclines towards a lower surface of the upper wall from the upper surface to the second light passing portion.

3. The light reception/emission element module according to claim 2, wherein the upper wall comprises a second light shielding portion which is located on an imaginary line connecting the fourth inclined surface and a light receiving region of the first light receiving element.

4. The light reception/emission element module according to claim 1, wherein the upper wall further comprises a peripheral portion surrounding the first light passing portion, the second light passing portion, and the intermediate portion, and
  the intermediate portion comprises a third light shielding portion which is located on an imaginary line connecting an inner surface of the first light passing portion in the peripheral portion and a light receiving region of the first light receiving element.

5. The light reception/emission element module according to claim 1, wherein the upper wall further comprises a peripheral portion surrounding the first light passing portion, the second light passing portion, and the intermediate portion, and
  the intermediate portion comprises a fourth light shielding portion which is located on an imaginary line connecting an inner surface of the second light passing portion in the peripheral portion and a light receiving region of the first light receiving element.

6. The light reception/emission element module according to claim 1, wherein the intermediate portion comprises a fifth light shielding portion which is located on an imaginary line that inclines upward, from the inner surface of the first light passing portion, at a same angle as an angle at which the imaginary line connecting the inner surface of the first light passing portion inclines downward, with respect to the inner surface of the first light passing portion.

7. The light reception/emission element module according to claim 1, wherein the intermediate portion comprises a sixth light shielding portion which is located on an imaginary line that inclines upward, from the inner surface of the second light passing portion, at a same angle as an angle at which the imaginary line connecting the inner surface of the second light passing portion inclines downward, with respect to the inner surface of the second light passing portion.

8. The light reception/emission element module according to claim 1, wherein the lower surface of the intermediate portion further comprises a top portion protruding downward, and the intermediate portion comprises a seventh light shielding portion which is located on an imaginary line connecting the top portion and a light receiving region of the first light receiving element.

9. The light reception/emission element module according to claim 1, wherein the upper wall is disposed midway in a height direction of the side wall, and a portion of the side wall is located on an imaginary line connecting an upper end of the first light passing portion and a light receiving region of the first light receiving element.

10. The light reception/emission element module according to claim 1, wherein the upper wall is disposed midway in a height direction of the side wall, and a portion of the side wall is located on an imaginary line connecting an upper end of the second light passing portion and a light receiving region of the first light receiving element.

11. A sensor device, comprising:

the light reception/emission element module according to claim 1; and a control circuit which is connected to the light reception/emission element module, and which controls the light reception/emission element module.

\* \* \* \* \*